(12) United States Patent
Tsai et al.

(10) Patent No.: US 7,551,415 B2
(45) Date of Patent: Jun. 23, 2009

(54) REPAIR CIRCUITRY WITH AN ENHANCED ESD PROTECTION DEVICE

(75) Inventors: Ming-Hsien Tsai, Sindian (TW);
Hung-Jen Liao, Hsin-Chu (TW);
Sung-Chieh Lin, Science-Based Industrial Park Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 249 days.

(21) Appl. No.: 11/512,830

(22) Filed: Aug. 30, 2006

(65) Prior Publication Data
US 2008/0062605 A1    Mar. 13, 2008

(51) Int. Cl.
*H02H 3/22* (2006.01)
(52) U.S. Cl. .......................... 361/56; 361/111
(58) Field of Classification Search ................ 361/56, 361/111
See application file for complete search history.

(56) References Cited

U.S. PATENT DOCUMENTS

| 6,385,021 B1 * | 5/2002 | Takeda et al. .................. 361/56 |
| 7,102,862 B1 * | 9/2006 | Lien et al. ...................... 361/56 |
| 7,271,989 B2 * | 9/2007 | Huang et al. ................ 361/91.1 |

* cited by examiner

*Primary Examiner*—Danny Nguyen
(74) *Attorney, Agent, or Firm*—K & L Gates LLP

(57) ABSTRACT

A repair circuitry consisting of at least one electrical fuse forming part of a conduction path between a positive voltage supply (Vq) pad and a complimentary lower voltage supply source (Vss). The repair circuitry includes at least one switching device and at least one control circuitry. The at least one switching device has a control terminal and is coupled between the Vq pad and the at least one electrical fuse. The at least one control circuitry is coupled to the control terminal and the Vq pad respectively. Upon an application of a positive high voltage to the Vq pad, the control circuitry delays the turned-on state of the switching device for a predetermined period of time, thereby blocking stray currents occurred during ESD events. Consequently, the repair circuitry can prevent the at least one electrical fuse from being mistakenly programmed.

16 Claims, 4 Drawing Sheets

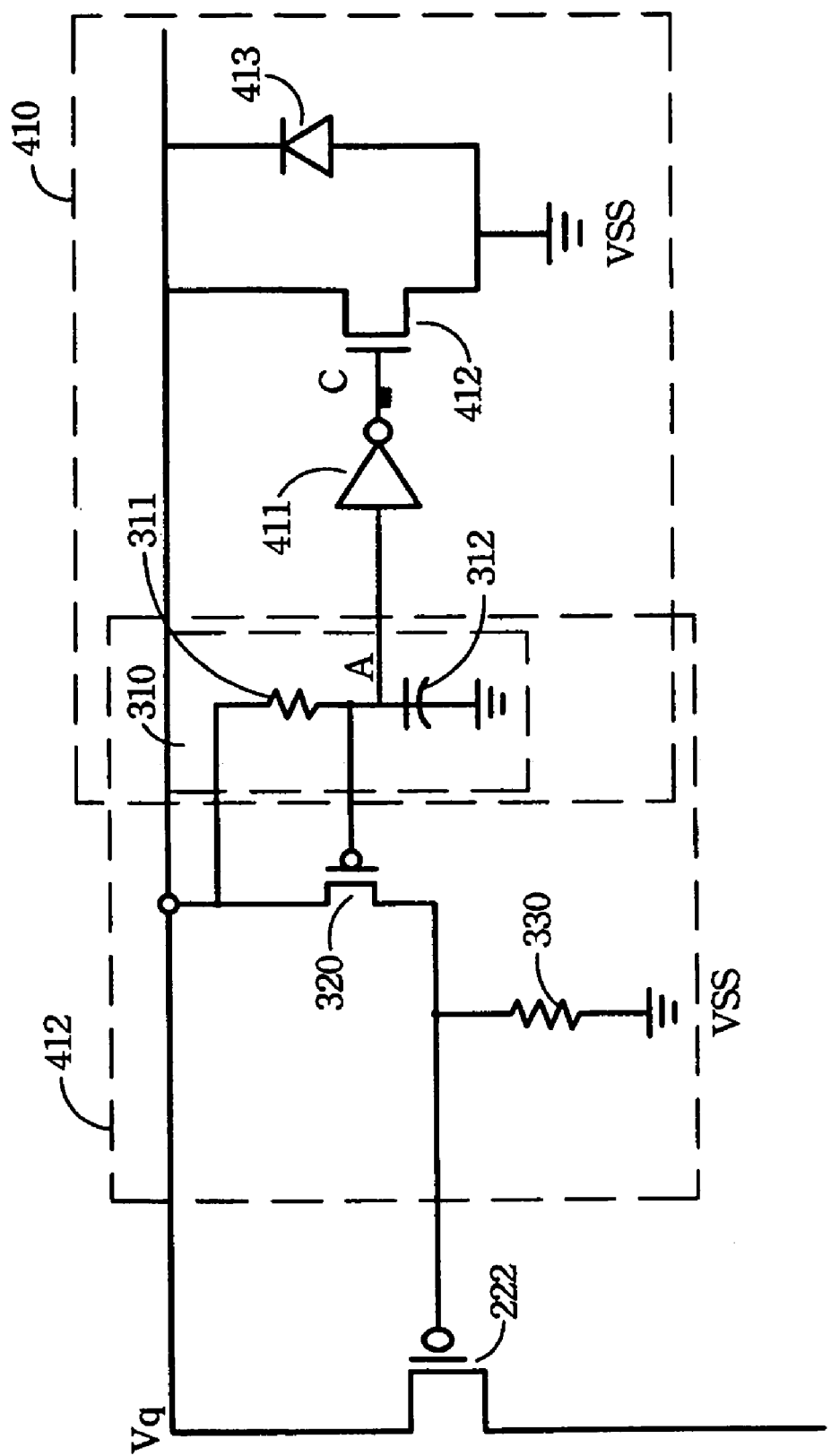
F I G. 4

REPAIR CIRCUITRY WITH AN ENHANCED ESD PROTECTION DEVICE

BACKGROUND

The present invention relates generally to a repair circuitry for a semiconductor device, and more particularly to a repair circuitry with an electrostatic discharge (ESD) protection device to prevent an electrical fuse from being mistakenly blown by an ESD event.

System-on-Chip (SoC) typically embeds memory IP cores with very large aggregate bit count per SoC. Because such memory IP cores are of high cell density, the embedded memories are more prone to defects that already exist in silicon substrate than any other component on the chip. New self-repair algorithm is therefore developed to test and repair embedded memory devices on SoCs. This new technology can improve typical SoC yields by as much as 82 percent over traditional external test and repair systems.

Such self-repair algorithms are usually achieved by applying electrical fuse circuits in semiconductor devices, such as chip ID, serial number, security key, analog trimming, memory redundancy, and boot ROM patch. The electrical fuses are programming silicided poly fuse, generally consist of, for example, polycrystalline silicon, or a similar suitable material that can be fused or melted through the action of energy. So, by passing a relatively large current through a particular electrical fuse, the electrical fuse will melt and disconnect a pre-programmed circuit. Eventually, the connection will go through another path, thereby reprogramming the circuit.

However, electrical fuses can be mistakenly programmed by stray currents during an ESD event. During an ESD event, charge is transferred between one or more pins of the integrated circuits and another conducting object in less than one microsecond. For instance, the market requirement for human-body mode ESD durability is 2 kilovolts. The standard human-body model assumes a static charge transfer of about 0.1 micro-Coulombs ($10^{-7}$ C) upon static electricity discharge between a human and a chip. Such charge is relatively large as the gate oxide thickness is only about $10^{-6}$ cm. That means the electric fields in the gate oxide are on the order of $10^{13}$ v/cm. As a result, the electrical fuse can be easily brown by an ESD event in a very short time.

FIG. 1 shows a repair circuitry 100 for a memory IP core. The repair circuitry 100 includes an electrical fuse 102 coupled to a positive power supply (Vq) pad and a clamp circuit 101 consisting of two clamp diodes 107 and 108 for ESD protection. It is known that ESD stray current can flow over device surface or junctions. As illustrated in FIG. 1, ESD stray current can flow through path P1 or path P2. Even though the Vq pad has an ESD clamp circuit 101, some stray current may still flow through the fuse path P2. Referring to FIG. 1, PMOS transistor 103 is controlled by a bit-line (BL) and the NMOS transistor 104 by a word-line (WL). For path P2, if both the PMOS transistor 103 and the NMOS transistor 104 are at a turned-on or even weakly turned-on state during an ESD event, then the ESD stray current will flow through path P2 created by the electrical fuse 102, and accidentally blow the electrical fuse 102.

As such, what is needed is a new design of the repair circuitry that can automatically switch off its connection to the positive power supply pad when an ESD event occurs, and then automatically switch on its connection during normal operations.

SUMMARY

In view of the foregoing, to prevent an electrical fuse circuit of a repair circuitry from being damaged by ESD zap, the repair circuitry of the invention consisting of at least one electrical fuse forming part of a conduction path between a positive voltage supply (Vq) pad and a complimentary lower voltage supply source (Vss). The repair circuitry includes at least one switching device and at least one control circuitry. The at least one switching device has a control terminal and is coupled between the Vq pad and the at least one electrical fuse. The at least one control circuitry is coupled to the control terminal and the Vq pad respectively. Upon an application of a positive high voltage to the Vq pad, the control circuitry delays the turned-on state of the switching device for a predetermined period of time, thereby blocking stray currents occurred during ESD events. Consequently, the repair circuitry can prevent the at least one electrical fuse from being mistakenly programmed.

A preferred embodiment of the invention also provides a method for preventing an electrical fuse from being blown during an electrostatic discharge (ESD) test. The method includes the steps of providing a switching device coupled between a positive voltage supply (Vq) pad and the electrical fuse, turning off the switching device upon an application of a positive high voltage for the ESD test at the Vq pad, and turning on the switching device after a predetermined period of time subsequent to the application of the positive high voltage at the Vq pad. The stray current from the ESD test is therefore blocked by the switching device for the predetermined period of time during an ESD test.

The circuitry and method of operating the invention, however, together with additional objectives and advantages thereof will be best understood from the following description of specific embodiments when read in connection with the accompanying drawings.

BRIEF DESCRIPTION OF THE DRAWINGS

FIG. 4 illustrates a detailed implementation of the repair circuitry for a memory IP core according to yet another preferred embodiment of the present invention.

DESCRIPTION

As the electrical fuses are widely applied in an integrated circuit, a robust electrical fuse circuit can efficiently improve the yield of an entire SoC. As a preferred embodiment, the present invention provides an improved repair circuitry for a memory IP core with at least one switching device and at least one control circuitry to prevent the electrical fuses from being advertently programmed, thereby increasing the yield of the entire SoC.

Figure 1:
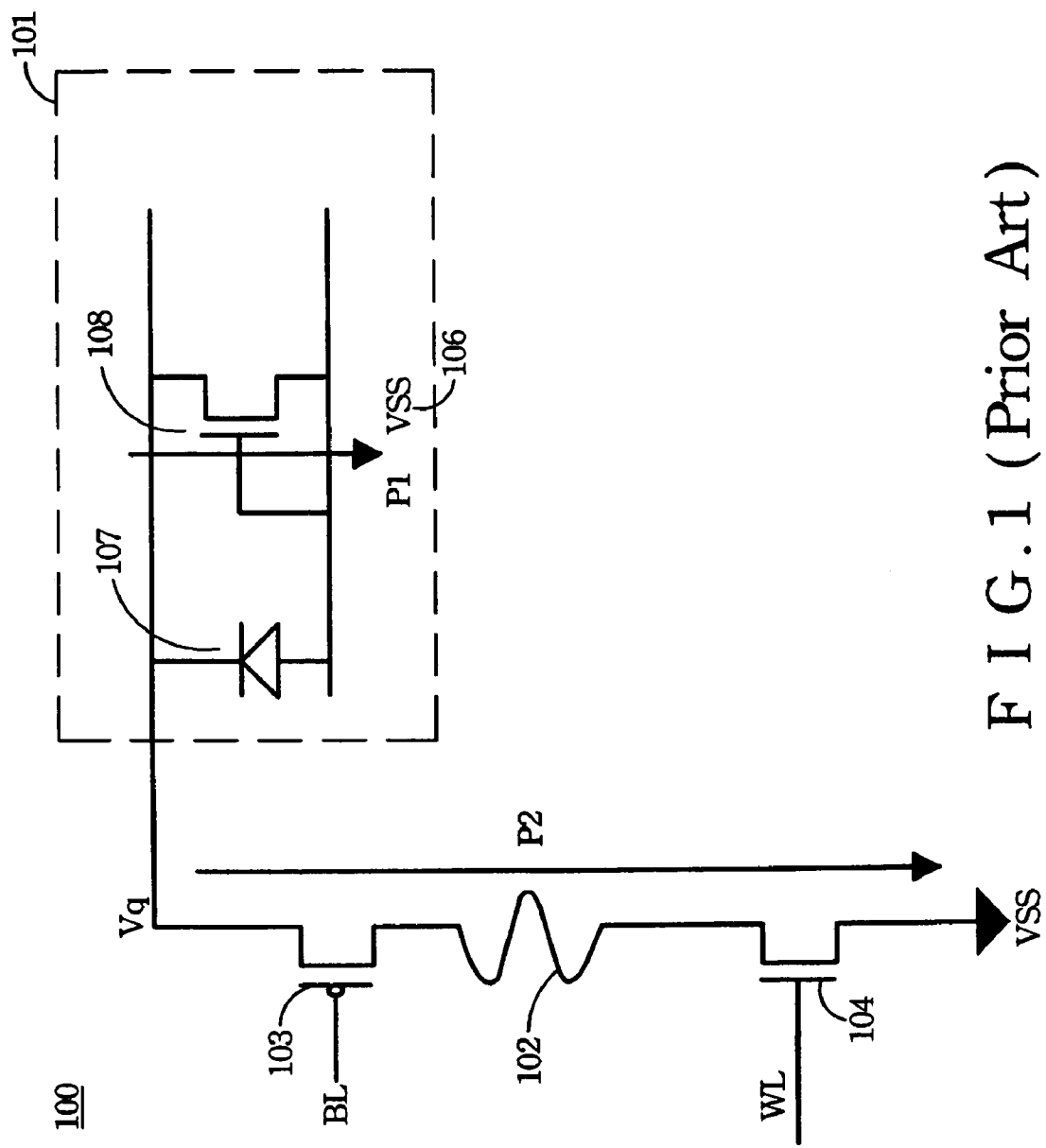
FIG. 1 illustrates a conventional repair circuitry for a memory IP core without an enhanced ESD protection device.

FIG. 1 has already been described and discussed as the relevant background to the present invention. It requires no further discussion here.

Figure 2:
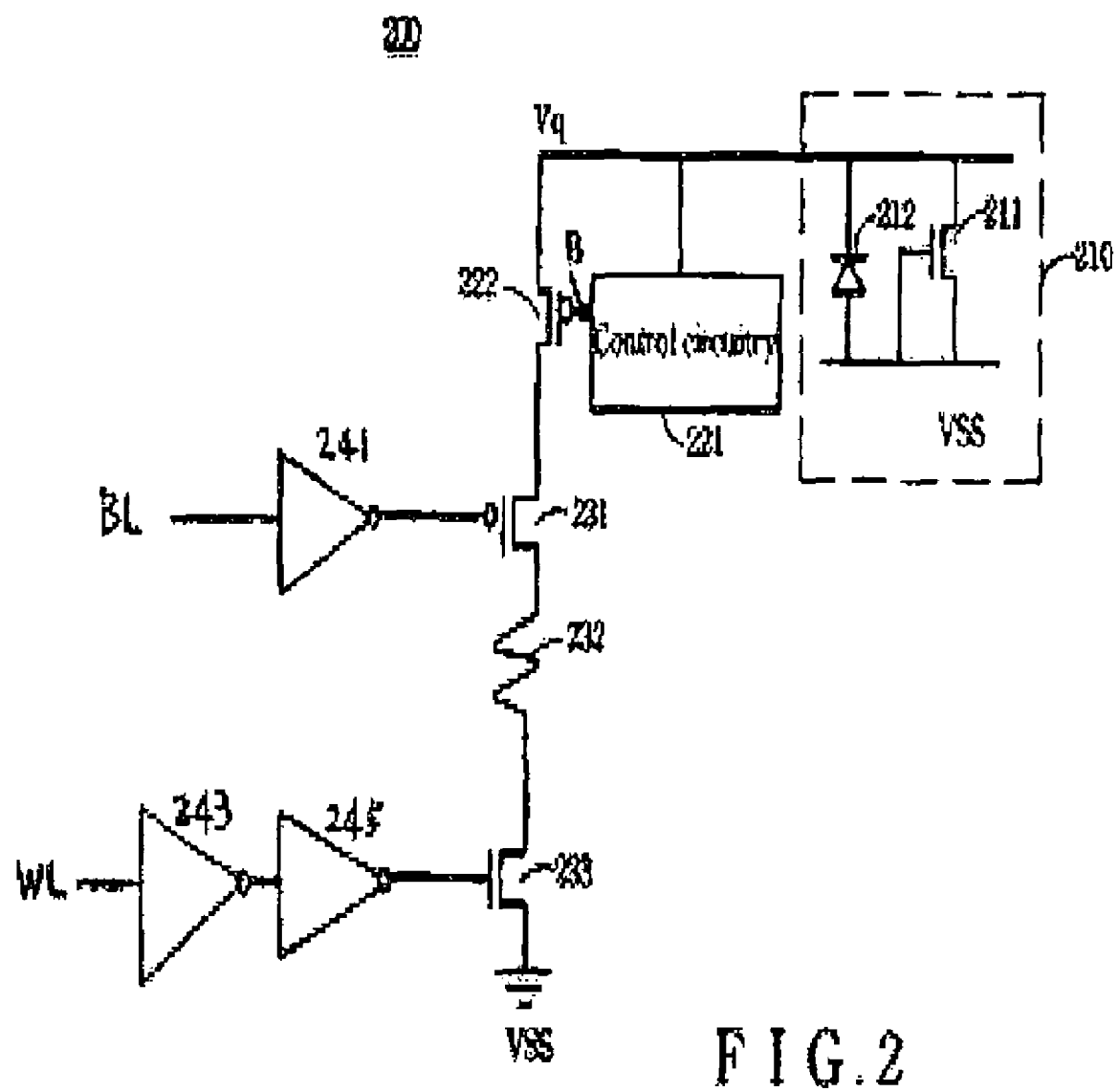
FIG. 2 illustrates an improved repair circuitry for a memory IP core according to a preferred embodiment of the present invention.

FIG. 2 shows the repair circuitry 200 with an enhanced ESD protection device according to a preferred embodiment of the invention. In addition to the ESD clamp circuit 210, which includes two diodes 211 and 212, the improved repair circuitry 200 further includes a switching device 222 and a control circuitry 221.

In FIG. 2, the embodiment has at least one electrical fuse 232 forming at least one conduction path from a positive power supply (Vq) pad to a complimentary lower supply voltage (Vss). The switching device 222 is implemented as a PMOS transistor and designed to provide a direct path to the Vq pad to ensure that a node rises as Vq rises. The control circuitry 221 is coupled to the Vq pad for driving the switching device 222. During an ESD event when Vq pad supplies high voltage, the control circuitry 221 is driven to turn off the switching device 222, thereby preventing ESD stray current from flowing through the conduction path formed by the electrical fuse 232.

The conduction path further includes two switching devices, a PMOS transistor 231 and an NMOS transistor 233. The PMOS transistor 231 is controlled by a predetermined bit-line (BL) which is coupled to the gate of the PMOS transistor 231 through an odd number of inverters, e.g., an inverter 241. On the other hand, the NMOS transistor 233 is controlled by a predetermined word-line (WL), which is coupled to the gate of the NMOS transistor through an even number of inverters 243 and 245. During the programming stage when the electrical fuse 232 is assigned to be programmed, the bit-line BL and word-line WL will be enabled to turn on the PMOS transistor 231 and the NMOS transistor 233 respectively. In this embodiment, the cascaded switching devices 222, 231 and 233 have the advantage of decreasing snapback occurrence during ESD zapping.

Figure 3:
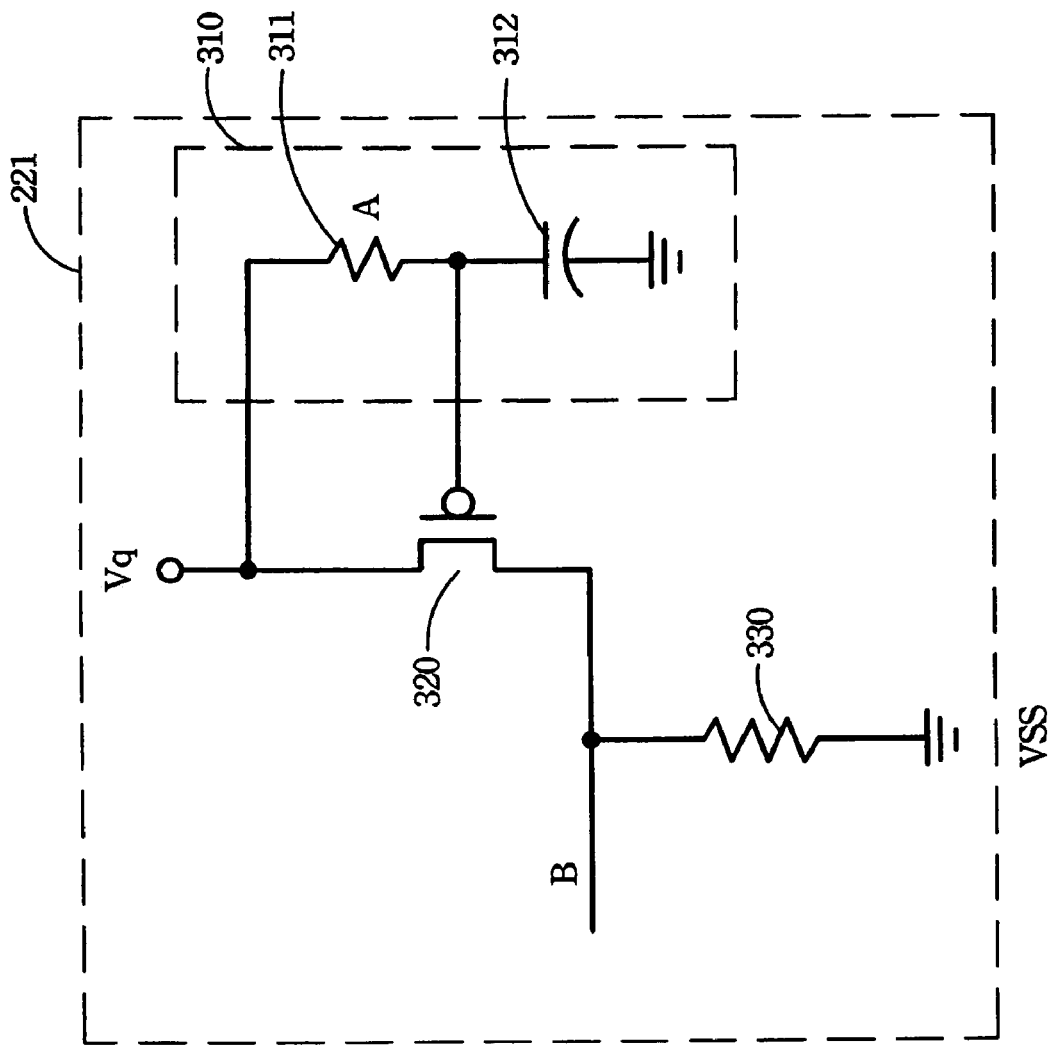
FIG. 3 illustrates a detailed implementation of the control circuitry for the repair circuitry according to the preferred embodiment of the present invention.

FIG. 3 illustrates a detailed implementation of the control circuitry for the repair circuitry according to a preferred embodiment of the present invention. At the moment when a high voltage is applied to the Vq pad, voltage at node A still maintains at Vss due to a capacitor 312. So, at that moment a PMOS transistor 320 is on, which in turn pulls up the node B. With node B at high voltage, the switching PMOS transistor 222 is turned off, so that the fuse path is protected. But over time the high voltage at Vq will charge up the capacitor 312, and raise the node A voltage, and eventually turns off the PMOS transistor 320. Then, the node B voltage will be pulled to Vss, which will turn on the switching PMOS transistor 222 to allow the fuse circuitry to function, normally. A resistor 311 limits the rate that the capacitor 312 is charged up by the high voltage at pad Vq. Increasing resistance value of the resistor 311 can put more delays on the turn-on of the switching PMOS transistor 222. Another resistor 330 is added to limit the currents flowing through the PMOS transistor 320, allowing the node B be pulled up to a high voltage.

If the high voltage applied at the Vq pad is due to an ESD event, which lasts only a very short period of time, the initial turned-off state of the switching PMOS 222 will protect the electrical fuse 232 from damaged by ESD stray currents. On the other hand, if the high voltage applied at the Vq pad is intended to blow the electrical fuse 232, then after a predetermined period of time, which is determined by the values of the resistor 311 and capacitor 312, the switching PMOS transistor will be turned on, allowing the fuse 232 to be blown as intended. Basically, the resistor 311 and the capacitor 312 together form a pull-up circuitry 310, which functions in a way of turning on the PMOS transistor 320 initially, and turning it off after a predetermined period of time. The predetermined period of time is determined by the resistance value of the resistor 311 and the capacitance value of the capacitor 312. Of course, the function carried out by the pull-up circuitry 310 can be implemented by various other circuitries.

Alternatively, the control circuitry 221 can include an even number of inverters (not shown) between node A and the gate of the PMOS transistor 320, and still functions the same as the control circuitry 221 shown in FIG. 3.

FIG. 4 shows another preferred embodiment of the invention where the ESD clamp circuit 410 and the control circuitry 421 share the same resistor 311 and capacitor 312 of the pull-up circuitry 310. It is known that the physical size of a conventional clamp circuit needs to be sufficiently large to carry a large amount of ESD current flow. The embodiment of FIG. 4 can save about 10% of the precious die area of the repair circuitry for a memory IP core. In this embodiment, the gate-driven technique is again applied to the switching device 222 and the PMOS transistors 320.

Referring to FIG. 4, during an ESD event, node A voltage is initially low due to the capacitor 312. Node C is inverted to high voltage which turns on an NMOS transistor 412, so that part of ESD current is shunned through the NMOS transistor 412. The control circuitry 421 operates in the same way as the control circuitry 221 shown in FIG. 3. Hence, it is not repeatedly discussed here.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A repair circuitry having at least one electrical fuse forming part of a conduction path between a positive voltage supply pad and a complimentary lower voltage supply source, the repair circuitry comprising:

at least one first switching device having a control terminal and coupled between the positive voltage supply pad and the at least one electrical fuse;

at least one second switching device controlled by a predetermined bit-line and coupled between the at least one first switching device and the at least one electrical fuse, wherein the at least one second switching device is a PMOS transistor and the predetermined bit-line is coupled to the gate of the PMOS transistor through an odd number of inverters; and at least one control circuitry coupled to the control terminal and the positive voltage supply pad respectively, wherein the at least one control circuitry delays the turn-on state of the first switching device for a predetermined period of time upon an application of a positive high voltage to the positive voltage supply pad.

2. The repair circuitry of claim 1, wherein the at least one first switching device is a PMOS transistor with a gate as the control terminal, a source coupled to the positive voltage supply pad and a drain coupled to the at least one electrical fuse.

3. The repair circuitry of claim 1, wherein the at least one control circuitry comprises:
   a pull-up circuitry coupled between the positive voltage supply pad and the complimentary lower voltage supply source; and
   at least one PMOS transistor with a source coupled to the positive voltage supply pad, a drain couple to the at least one control terminal, and a gate coupled to the pull-up circuitry,
   wherein the pull-up circuitry delays the turned-off state of the PMOS transistor for the predetermined period of time.

4. The repair circuitry of claim 3, wherein the pull-up circuitry comprises:
   at least one resistor coupled to the positive voltage supply pad; and
   at least one capacitor coupled between the resistor and the complimentary lower voltage supply source with a common terminal of the resistor and the capacitor coupled to the gate of the at least one PMOS transistor.

5. The repair circuitry of claim 4, wherein the resistor and the capacitor of the pull-up circuitry are shared with an electrostatic discharge (ESD) clamp circuit.

6. The repair circuitry of claim 1, further comprising:
   at least one third switching device controlled by a predetermined word-line and coupled between the at least one electrical fuse and the complimentary lower supply voltage source.

7. The repair circuitry of claim 6, wherein the at least one third switching device is an NMOS transistor, and the predetermined word-line is coupled to the gate of the NMOS transistor through an even number of inverters.

8. A repair circuitry having at least one electrical fuse forming part of a conduction path between a positive voltage supply pad and a complimentary lower voltage supply source, the repair circuitry comprising:
   at least one first PMOS transistor with a source coupled to the positive voltage supply pad and a drain coupled to the at least one electrical fuse;
   at least one first switching device controlled by a predetermined word-line and coupled between the at least one electrical fuse and the complimentary lower supply voltage source, wherein the at least one first switching device is an NMOS transistor and the predetermined word-line is coupled to the gate of the NMOS transistor through an even number of inverters; and
   at least one control circuitry coupled to a gate of the PMOS transistor and the positive voltage supply pad respectively,
   wherein the at least one control circuitry delays the turned-on state of the first PMOS transistor for a predetermined period of time upon an application of a positive high voltage to the positive voltage supply pad.

9. The repair circuitry of claim 8, wherein the control circuitry comprises:
   a pull-up circuitry coupled between the positive voltage supply pad and the complimentary lower voltage supply source; and
   at least one second PMOS transistor with a source coupled to the positive voltage supply pad, a drain couple to the control terminal, and a gate coupled to the pull-up circuitry,
   wherein the pull-up circuitry delays the turned-off state of the at least one second PMOS transistor for the predetermined period of time.

10. The repair circuitry of claim 9, wherein the pull-up circuitry comprises:
    at least one resistor coupled to the positive voltage supply pad; and
    at least one capacitor coupled between the resistor and the complimentary lower voltage supply source with a common terminal of the resistor and the capacitor coupled to the gate of the at least one second PMOS transistor.

11. The repair circuitry of claim 10, wherein the resistor and the capacitor of the pull-up circuitry are shared with an electrostatic discharge (ESD) clamp circuit.

12. The repair circuitry of claim 8, further comprising:
    at least one second switching device controlled by a predetermined bit-line and coupled between the at least one first switching device and the at least one electrical fuse.

13. The repair circuitry of claim 12, wherein the at least one second switching device is a PMOS transistor, and the predetermined bit-line is coupled to the gate of the PMOS transistor through an odd number of inverters.

14. A method for preventing an electrical fuse from being blown during electrostatic discharge (ESD) test, the method comprising:
    providing a first switching device coupled between a positive voltage supply pad and the electrical fuse;
    providing a second switching device controlled by a predetermined bit-line and coupled between the first switching device and the electrical fuse, wherein the second switching device is a PMOS transistor and the predetermined bit-line is coupled to the gate of the PMOS transistor through an odd number of inverters; and
    turning on the first switching device upon an application of a positive high voltage for the ESD test at a positive voltage supply pad for a predetermined period of time;
    whereby blocking stray currents occurred during the ESD test.

15. The method of claim 14 further comprising:
    turning on the first switching device after a predetermined period of time subsequent to the application of the positive high voltage at the positive voltage supply pad.

16. The method of claim 14, wherein the first switching device is a PMOS transistor.

* * * * *